United States Patent
Feng et al.

(10) Patent No.: US 12,199,203 B2
(45) Date of Patent: *Jan. 14, 2025

(54) BUSBAR-FREE INTERDIGITATED BACK CONTACT SOLAR CELL AND INTERDIGITATED BACK CONTACT SOLAR CELL MODULE

(71) Applicants: JINKO SOLAR (HAINING) CO., LTD., Haining (CN); ZHEJIANG JINKO SOLAR CO., LTD., Zhejiang (CN)

(72) Inventors: Xiu Feng, Zhejiang (CN); Menglei Xu, Zhejiang (CN); Jie Yang, Zhejiang (CN); Xinyu Zhang, Zhejiang (CN); Hao Jin, Zhejiang (CN)

(73) Assignees: Jinko Solar (Haining) Co., Ltd., Jiaxing (CN); Zhejiang Jinko Solar Co., Ltd., Zhejiang (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/234,845

(22) Filed: Aug. 16, 2023

(65) Prior Publication Data
US 2023/0395734 A1 Dec. 7, 2023

Related U.S. Application Data

(63) Continuation of application No. 17/549,732, filed on Dec. 13, 2021, now Pat. No. 11,764,317.

(30) Foreign Application Priority Data

Nov. 5, 2021 (CN) .......................... 202111308293.6

(51) Int. Cl.
*H01L 31/0224* (2006.01)

(52) U.S. Cl.
CPC ............ *H01L 31/022458* (2013.01); *H01L 31/022433* (2013.01)

(58) Field of Classification Search
CPC ............ H01L 31/022458; H01L 31/022433
See application file for complete search history.

(56) References Cited

U.S. PATENT DOCUMENTS

2011/0120530 A1    5/2011   Isaka
2017/0069776 A1*   3/2017   Yang .................. H01L 31/18

FOREIGN PATENT DOCUMENTS

CN     102569436 A     7/2012
CN     104103698 A    10/2014
(Continued)

OTHER PUBLICATIONS

Extended European Search Report for EP Application No. 21213758.2, dated May 18, 2022, in 8 pages.
(Continued)

*Primary Examiner* — Tae-Sik Kang
(74) *Attorney, Agent, or Firm* — Knobbe, Martens, Olson & Bear, LLP (57) ABSTRACT

Provided is a busbar-free interdigitated back contact (IBC) solar cell and an IBC solar cell module. The IBC solar cell includes a semiconductor substrate, finger electrode lines and conductive lines. The finger electrode lines include first finger electrode lines and second finger electrode lines that are alternately arranged on the semiconductor substrate. The conductive lines include first conductive lines and second conductive lines that are alternately arranged. The first conductive lines are connected to the first finger electrode lines and spaced apart from the second finger electrode lines. The second conductive lines are connected to the second finger electrode lines and spaced apart from the first finger electrode lines.

15 Claims, 3 Drawing Sheets

(56) References Cited

FOREIGN PATENT DOCUMENTS

| | | |
|---|---|---|
| CN | 106409929 A | 2/2017 |
| CN | 206595263 U | 10/2017 |
| CN | 109713074 A | 5/2019 |
| CN | 108269873 B | 6/2019 |
| CN | 110459618 A | 11/2019 |
| EP | 2709162 A1 | 3/2014 |
| EP | 3244454 A1 | 11/2017 |

OTHER PUBLICATIONS

Office Action dated May 29, 2024 in Chinese Application No. 202111308293.6 in 12 pages.

\* cited by examiner

BUSBAR-FREE INTERDIGITATED BACK CONTACT SOLAR CELL AND
INTERDIGITATED BACK CONTACT SOLAR
CELL MODULE

CROSS-REFERENCE TO RELATED APPLICATIONS

The present application is a continuation application of U.S. application Ser. No. 17/549,732, filed on Dec. 13, 2021, which claims priority to Chinese Patent Application No. 202111308293.6, filed on Nov. 5, 2021, the content of which is incorporated herein by reference in its entirety.

TECHNICAL FIELD

The present disclosure relates to the technical field of solar cells, and in particular, to a busbar-free interdigitated back contact (IBC) solar cell and an IBC solar cell module.

BACKGROUND

Solar energy is a clean and sustainable energy source. In the past, positive and negative poles of a solar cell were designed on two sides of the solar cell, which prevented irradiation of part of the sunlight into the solar cell due to the shielding of electrodes on a phototropic face, thereby reducing the utilization of solar energy. In order to make full use of the solar energy incident on a surface of the solar cell, electrodes are all designed on a backlight surface of an IBC solar cell, thus no electrode shields the phototropic face of the IBC solar cell, thereby enhancing the utilization of solar energy.

The IBC solar cell generally includes a semiconductor substrate and a metallized electrode structure arranged on the semiconductor substrate. A traditional IBC solar cell includes busbars in its metallized electrode structure. The busbar is formed by printing metallized paste on the semiconductor substrate by, for example, a screen printing process. A busbar-free metallized structure is developed and applied to IBC solar cells, to effectively reduce the use of the metallized paste and simplify steps of the screen printing process, thereby reducing manufacturing costs of the IBC solar cells. Therefore, it is of great significance to develop a busbar-free metallized structure for mass production and large-scale promotion of the IBC solar cells.

SUMMARY

The present disclosure provides a busbar-free IBC solar cell and an IBC solar cell module, so as to solve the problems of high manufacturing costs and a large usage amount of metallized paste due to presence of a busbar in the metallized electrode structure of the IBC solar cell.

The present disclosure provides a busbar-free IBC solar cell, including: a semiconductor substrate; a plurality of finger electrode lines including a plurality of first finger electrode lines and a plurality of second finger electrode lines; and a plurality of conductive lines including a plurality of first conductive lines and a plurality of second conductive lines. The plurality of first finger electrode lines and the plurality of second finger electrode lines are alternately arranged on the semiconductor substrate. The plurality of first conductive lines and the plurality of second conductive lines are alternately arranged. The plurality of first conductive lines is connected to the plurality of first finger electrode lines and spaced apart from the plurality of second finger electrode lines. The plurality of second conductive lines is connected to the plurality of second finger electrode lines and spaced apart from the plurality of first finger electrode lines.

In one or more embodiments, each of the plurality of first finger electrode lines is formed by a plurality of first finger electrode sub-lines arranged at intervals, and a first interval is provided between two adjacent first finger electrode sub-lines of the plurality of first finger electrode sub-lines. Each of the plurality of second finger electrode lines is formed by a plurality of second finger electrode sub-lines arranged at intervals, and a second interval is provided between two adjacent second finger electrode sub-lines of the plurality of second finger electrode sub-lines. For adjacent first finger electrode line and second finger electrode line, the first interval of the first finger electrode line and the second interval of the second finger electrode line are mutually staggered. The first conductive line passes through the second interval, and the second conductive line passes through the first interval.

In one or more embodiments, a width c1 of the first interval and a width c2 of the second interval both range from 100 μm to 1000 μm.

In one or more embodiments, the first conductive line passes through a middle position of the second interval, and the second conductive line passes through a middle position of the first interval.

In one or more embodiments, a first branched finger electrode line and a second branched finger electrode line are connected to one end of the first finger electrode sub-line close to the first interval; and a third branched finger electrode line and a fourth branched finger electrode line are connected to one end of the second finger electrode sub-line close to the second interval.

In one or more embodiments, an angle α between the first branched finger electrode line and the second branched finger electrode line satisfies 0°<α<90°, and an angle β between the third branched finger electrode line and the fourth branched finger electrode line satisfies 0°<β<90°.

In one or more embodiments, a fifth branched finger electrode line is connected to the end of the first finger electrode sub-line close to the first interval, and the fifth branched finger electrode line is located between the first branched finger electrode line (212) and the second branched finger electrode line; a sixth branched finger electrode line is connected to the end of the second finger electrode sub-line close to the second interval, and the sixth branched finger electrode line is located between the third branched finger electrode line and the fourth branched finger electrode line.

In one or more embodiments, lengths of the first branched finger electrode line, the second branched finger electrode line and the fifth branched finger electrode line are the same; and lengths of the third branched finger electrode line, the fourth branched finger electrode line and the sixth branched finger electrode line are the same.

In one or more embodiments, one or more fifth branched finger electrode lines are provided, and one or more sixth branched finger electrode lines are provided.

The present disclosure further provides an IBC solar cell module. The IBC solar cell module includes at least one IBC solar cell string formed by electrically connecting at least one IBC solar cell. The at least one IBC solar cell includes a semiconductor substrate; a plurality of finger electrode lines including a plurality of first finger electrode lines and a plurality of second finger electrode lines; and a plurality of conductive lines including a plurality of first conductive lines and a plurality of second conductive lines. The plurality of first finger electrode lines and the plurality of second finger electrode lines are alternately arranged on the semiconductor substrate. The plurality of first conductive lines and the plurality of second conductive lines are alternately arranged. The plurality of first conductive lines is connected to the plurality of first finger electrode lines and spaced apart from the plurality of second finger electrode lines. The plurality of second conductive lines is connected to the plurality of second finger electrode lines and spaced apart from the plurality of first finger electrode lines.

It should be understood that the general description above and the detailed description in the following are merely exemplary, and cannot limit the present disclosure.

The accompanying drawings herein, which are incorporated in and constitute a part of this specification, illustrate embodiments consistent with the present disclosure and, together with the specification, serve to explain principles of the present disclosure.

DESCRIPTION OF EMBODIMENTS

In order to better understand the technical solutions of the present disclosure, the following is a detailed description of embodiments of the present disclosure with reference to the accompanying drawings.

It should be made clear that the embodiments described are only part of rather than all of the embodiments of the present disclosure. All other embodiments acquired by those of ordinary skill in the art without creative efforts based on the embodiments of the present disclosure shall fall within the protection scope of the present disclosure.

The terms used in the specification of the present disclosure are intended only to describe particular embodiments and are not intended to limit the present disclosure. As used in the embodiments of the present disclosure and the appended claims, the singular forms of "a/an", "the", and "said" are intended to include plural forms, unless otherwise clearly specified by the context.

It is to be understood that the term "and/or" used herein is merely an association relationship describing associated objects, indicating that three relationships may exist. For example, A and/or B indicates that there are three cases of A alone, A and B together, and B alone. In addition, the character "/" herein generally means that associated objects before and after "/" are in an "or" relationship.

It is to be noted that orientation words such as "above", "below", "left" and "right" described in the embodiments of the present disclosure are described from perspectives as shown in the accompanying drawings and should not be understood as limitations on the embodiments of the present disclosure. In addition, in the context, it is to be further understood that, when one element is connected "above" or "below" another element, it can not only be directly connected "above" or "below" the other element, but also be indirectly connected "above" or "below" the other element through an intermediate element.

A solar cell is a semiconductor device that converts solar energy into electric energy. Low manufacturing costs and high energy conversion efficiency have always been the goal of the solar cell industry. For an IBC solar cell, all electrodes are disposed on a backlight surface of the solar cell, and no electrode shields a light incident surface of the IBC solar cell, thereby effectively increasing a short-circuit current of the solar cell and improving energy conversion efficiency of the solar cell. An existing IBC solar cell generally includes a semiconductor substrate and a metallized electrode structure arranged on the semiconductor substrate. The metallized electrode structure includes finger electrodes and a busbar. When the IBC solar cell is in operation, currents are first collected to the nearest finger, and then collected through the finger to the busbar connected thereto and a conductive line (e.g., an external solder strip) connected to the busbar, and then the currents are drawn out. The busbar in the metallized electrode structure is generally made of relatively expensive silver paste, which has high costs, a large width and thus a large usage amount. The busbar covers the solar cell and shields a lot of light receiving areas, which may reduce photoelectric conversion efficiency of the solar cell.

With respect to the problems of high manufacturing costs, a large usage amount of metallized paste and reduction of photoelectric conversion efficiency of the solar cell due to presence of a busbar in the metallized electrode structure of the existing IBC solar cell, the applicant has found according to studies that the IBC solar cell requires a wider finger and can achieve high efficiency even under the design of a relatively large line width. Moreover, the design of wide electrode lines enables an effect of firm soldering with the conductive line, thereby achieving the purpose of replacing the busbar by the conductive line.

Figure 1:
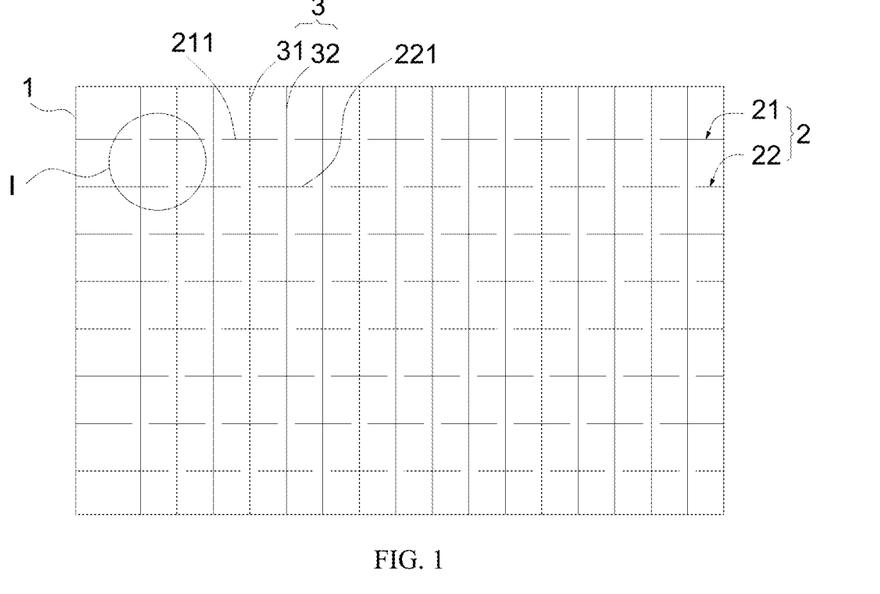
FIG. 1 is a schematic structural diagram of a busbar-free IBC solar cell according to a first embodiment of the present disclosure.

In consideration of the above, according to some embodiments of the present disclosure, a busbar-free IBC solar cell is proposed. The IBC solar cell may be a P-type IBC solar cell or an N-type IBC solar cell. As shown in FIG. 1, the IBC solar cell includes a semiconductor substrate 1, a plurality of finger electrode lines 2 and a plurality of conductive lines 3. In some embodiments, the semiconductor substrate 1 is a semiconductor silicon wafer. The semiconductor silicon wafer may be made of, for example, monocrystalline silicon, polycrystalline silicon or microcrystalline silicon. The finger electrode line 2 may be made of a metal material with good electrical conductivity. In some embodiments, the finger electrode line 2 is made of silver or aluminum paste, and the finger electrode line 2 may have a width ranging from 10 μm to 150 μm. The conductive line 3 has good electrical conductivity. In some embodiments, the conductive line 3 is a tinned copper conductive line. The finger electrode line 2 can collect and direct currents generated by a photovoltaic effect to the conductive line 3. The conductive line 3 then draws out the collected currents. The finger electrode line 2 and the conductive line 3 form a power hub of the IBC solar cell. For the IBC solar cell, the finger electrode line 2 and the conductive line 3 are designed on a back surface of the semiconductor substrate 1.

As shown in FIG. 1, the finger electrode line 2 includes a first finger electrode line 21 and a second finger electrode line 22. Among the first finger electrode line 21 and the second finger electrode line 22, one is a finger negative electrode line, and the other is a finger positive electrode line. The first finger electrode line 21 and the second finger electrode line 22 are alternately arranged on the semiconductor substrate 1. The first finger electrode line 21 and the second finger electrode line 22 form local or full ohmic contact with the semiconductor substrate 1, respectively. In some embodiments, when the first finger electrode line 21 and the second finger electrode line 22 form full ohmic contact with the semiconductor substrate 1, firing-through paste is placed at positions of the first finger electrode line 21 and the second finger electrode line 22 by a screen printing process, an inkjet printing process or a laser transfer process. Alternatively, the first finger electrode line 21 and the second finger electrode line 22 are formed by electroplating after opening or a physical vapor deposition (PVD) method. In some embodiments, when the first finger electrode line 21 and the second finger electrode line 22 form local ohmic contact with the semiconductor substrate 1, non-firing-through paste is placed at positions of the first finger electrode line 21 and the second finger electrode line 22 by a screen printing process, an inkjet printing process or a laser transfer process, or a metal layer is deposited by the PVD method.

The conductive line 3 includes a first conductive line 31 and a second conductive line 32 that are alternately arranged. The first conductive line 31 is connected to the first finger electrode line 21, and the first conductive line 31 is spaced apart from the second finger electrode line 22, to prevent short circuit caused by contact of the first conductive line 31 with the second finger electrode line 22. The second conductive line 32 is connected to the second finger electrode line 22, and the second conductive line 32 is spaced apart from the first finger electrode line 21, to prevent short circuit caused by contact of the second conductive line 32 with the first finger electrode line 21.

In an embodiment, the first conductive line 31 is vertically connected to the first finger electrode line 21, and the second conductive line 32 is vertically connected to the second finger electrode line 22.

The IBC solar cell according to some embodiments does not include any busbar, the conductive lines 3 instead of the busbars are directly connected to the finger electrode lines on the solar cell. High photoelectric conversion efficiency may also be achieved under the design of a relatively large line width when the IBC solar cell requires wider finger electrode lines. In addition, the design of wide finger electrode lines in the IBC solar cell enables a firm soldering between the finger electrode lines and the conductive lines 3.

Figure 2:
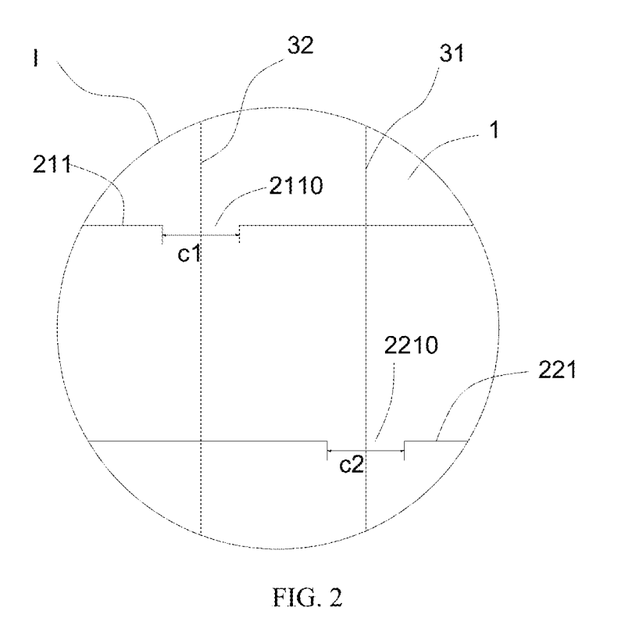
FIG. 2 is an enlarged view of part I in FIG. 1.

According to some embodiments of the present disclosure, as shown in FIG. 1 and FIG. 2, the first finger electrode line 21 is formed by a plurality of first finger electrode sub-lines 211 arranged at intervals, and the second finger electrode line 22 is formed by a plurality of second finger electrode sub-lines 221 arranged at intervals. In such a configuration, the first finger electrode line 21 and the second finger electrode line 22 form a segmented electrode line structure, which reduces a usage amount of paste and improves efficiency of the solar cell. A first interval 2110 is provided between two adjacent ones of the plurality of first finger electrode sub-lines 211. A second interval 2210 is provided between two adjacent ones of the plurality of second finger electrode sub-lines 221, and the first conductive line 31 passes through the second interval 2210. The first interval 2110 of the first finger electrode line 21 and the second interval 2210 of the second finger electrode line 22 adjacent to each other are mutually staggered, and the second conductive line 32 passes through the first interval 2110.

The first finger electrode line 21 and the second finger electrode line 22 according to some embodiments adopt a segmented electrode line structure, which can effectively reduce a usage amount of paste. With characteristics of the segmented electrode line structure, during maintenance of an effective connection between the first conductive line 31 and the first finger electrode line 21 with a same polarity, the first conductive line 31 passes through the second interval 2210 so that the first conductive line 31 is spaced apart from the second finger electrode line 22 with an opposite polarity. During maintenance of an effective connection between the second conductive line 32 and the second finger electrode line 22 with a same polarity, the second conductive line 32 passes through the first interval 2110 so that the second conductive line 32 is spaced apart from the first finger electrode line 21 with an opposite polarity. Such a configuration effectively prevents short circuit caused by the connection between the conductive line 3 and the finger electrode line 2 with opposite polarities.

According to some embodiments of the present disclosure, a width c1 of the first interval 2110 and a width c2 of the second interval 2210 range from 100 μm to 1000 μm. The width c1 of the first interval 2110 and the width c2 of the second interval 2210 may be, for example, 100 μm, 200 μm, 300 μm, 400 μm, 500 μm, 600 μm, 700 μm, 800 μm, 900 μm or 1000 μm, and may also be other values in the above range, which is not limited herein.

With the further limitations on the width c1 of the first interval 2110 and the width c2 of the second interval 2210, a transverse distance between the conductive line 3 and the finger electrode line 2 becomes larger without affecting current collection of the finger electrode line 2, and the risk of short circuit is greatly reduced.

According to some embodiments of the present disclosure, as shown in FIG. 1 and FIG. 2, the first conductive line 31 passes through a middle position of the second interval 2210. The second conductive line 32 passes through a middle position of the first interval 2110. That is, the first conductive line 31 is at a same distance from the second finger electrode sub-lines 221 on two sides, which is half the width c1 of the first interval 2110. In some embodiments, the distances between the first conductive line 31 and the second finger electrode sub-lines 221 on two sides range from 50 μm to 500 μm. The second conductive line 32 is at a same distance from the first finger electrode sub-lines 211 on two sides, which is half the width c2 of the second interval 2210. In some embodiments, the distances between the second conductive line 32 and the first finger electrode sub-lines 211 on two sides range from 50 μm to 500 μm.

The first conductive line 31 passes through a middle position of the second interval 2210 and the second conductive line 32 passes through a middle position of the first interval 2110, so that the first conductive line 31 and the second conductive line 32, when offset to two sides by the same amplitude, may not contact the second finger electrode sub-line 221 and the first finger electrode sub-line 211 to cause short circuit of the solar cell.

Figure 3:
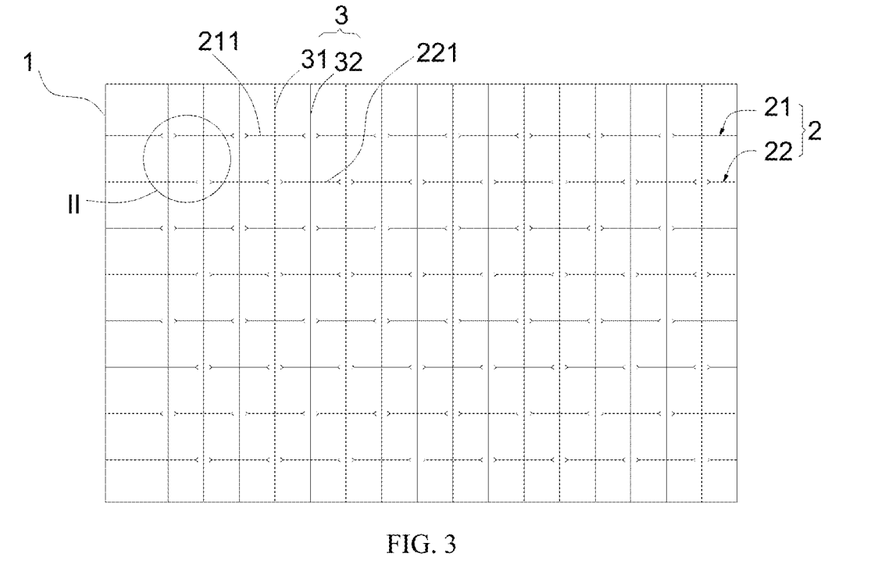
FIG. 3 is a schematic structural diagram of the busbar-free IBC solar cell according to a second embodiment of the present disclosure.
Figure 4:
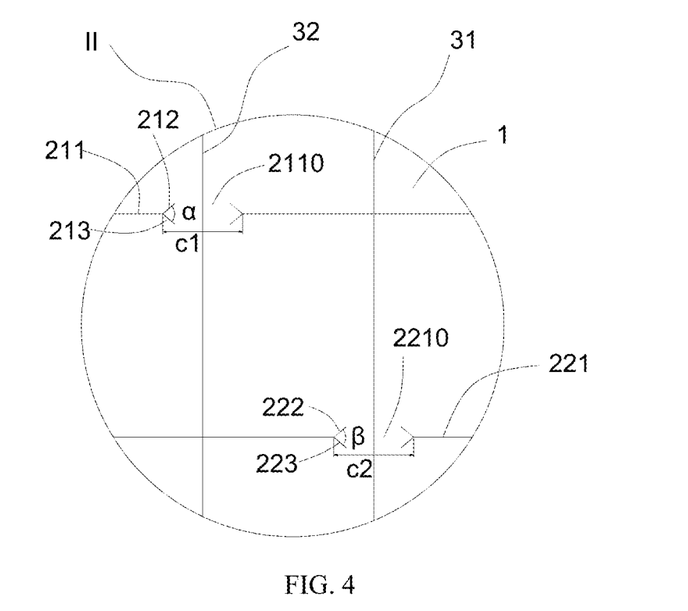
FIG. 4 is an enlarged view of part II in FIG. 3.

According to some embodiments of the present disclosure, as shown in FIG. 3 and FIG. 4, a first branched finger electrode line 212 and a second branched finger electrode line 213 are connected to one end of the first finger electrode sub-line 211 close to the first interval 2110. A third branched finger electrode line 222 and a fourth branched finger electrode line 223 are connected to one end of the second finger electrode sub-line 221 close to the second interval 2210. The first branched finger electrode line 212, the second branched finger electrode line 213, the third branched finger electrode line 222 and the fourth branched finger electrode line 223 are configured to improve a current collection effect of the finger electrode line and preventing current collection effect of the finger electrode line from being affected by an excessively large width between the first interval 2110 and the second interval 2210.

In the present disclosure, the current collection effect of the finger electrode line can be effectively improved by designing the first branched finger electrode line 212 and the second branched finger electrode line 213 at one end of the first finger electrode sub-line 211 close to the first interval 2110 and designing the third branched finger electrode line 222 and the fourth branched finger electrode line 223 at one end of the second finger electrode sub-line 221 close to the second interval 2210.

According to some embodiments of the present disclosure, an angle α between the first branched finger electrode line 212 and the second branched finger electrode line 213 satisfies 0°<α<90°. A region of the angle α between the first branched finger electrode line 212 and the second branched finger electrode line 213 adapts to an offset curve of the second conductive line 32. The angle α may be, for example, 5°, 10°, 20°, 30°, 40°, 50°, 60°, 70°, 80° or 85°, and may also be other values in the above range, which is not limited herein. An angle β between the third branched finger electrode line 222 and the fourth branched finger electrode line 223 satisfies 0°<β<90°. A region of the angle β between the third branched finger electrode line 222 and the fourth branched finger electrode line 223 adapts to an offset curve of the first conductive line 31. The angle β may be, for example, 5°, 10°, 20°, 30°, 40°, 60°, 70°, 80° or 85°, and may also be other values in the above range, which is not limited herein.

The limitations on the angle α between the first branched finger electrode line 212 and the second branched finger electrode line 213 and the angle β between the third branched finger electrode line 222 and the fourth branched finger electrode line 223 can ensure that the first conductive line 31 and the second conductive line 32 may not contact the first finger electrode line 21 and the second finger electrode line 22 when being offset, and can also more effectively improve the current collection effect of the finger electrode line.

Figure 5:
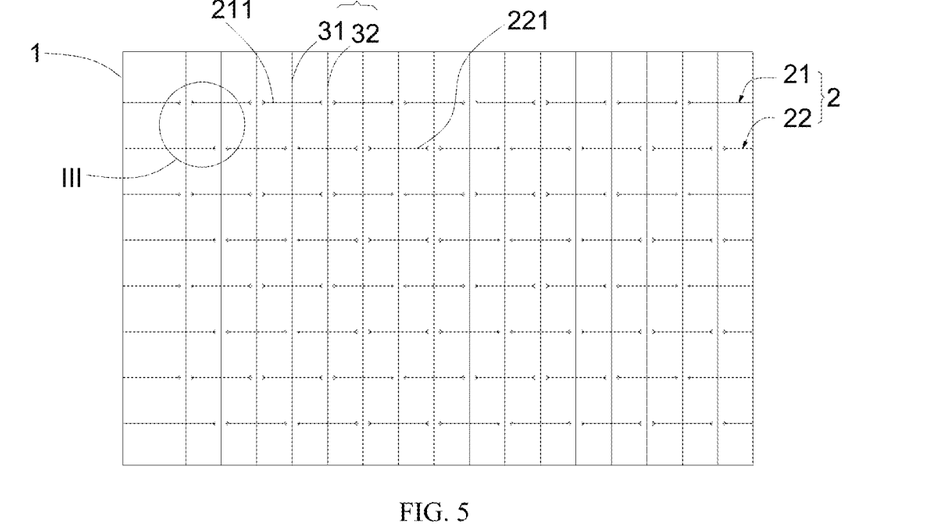
FIG. 5 is a schematic structural diagram of the busbar-free IBC solar cell according to a third embodiment of the present disclosure.
Figure 6:
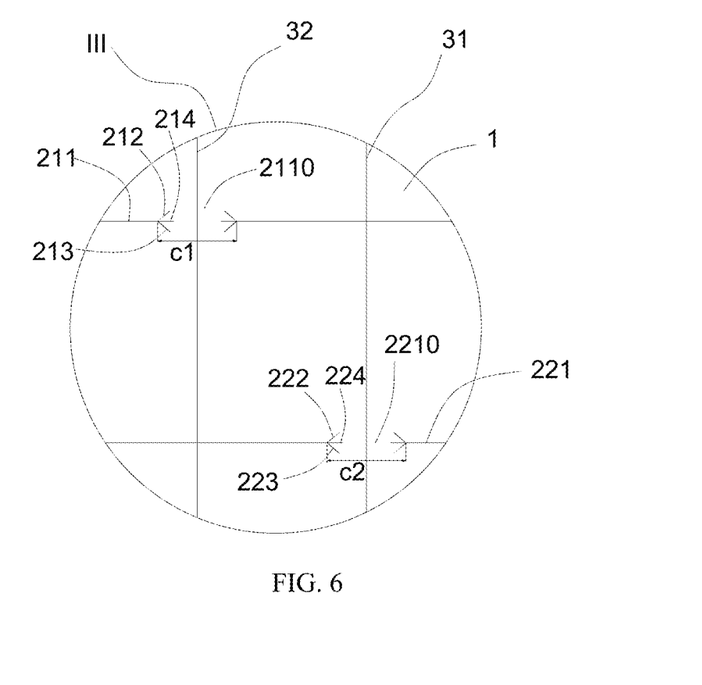
FIG. 6 is an enlarged view of part III in FIG. 5.

According to some embodiments of the present disclosure, as shown in FIG. 5 and FIG. 6, a fifth branched finger electrode line 214 is connected to the end of the first finger electrode sub-line 211 close to the first interval 2110, and the fifth branched finger electrode line 214 is located between the first branched finger electrode line 212 and the second branched finger electrode line 213. A sixth branched finger electrode line 224 is connected to the end of the second finger electrode sub-line 221 close to the second interval 2210, and the sixth branched finger electrode line 224 is located between the third branched finger electrode line 222 and the fourth branched finger electrode line 223.

The current collection effect of the finger electrode line can be more effectively improved by further designing the fifth branched finger electrode line 214 between the first branched finger electrode line 212 and the second branched finger electrode line 213 and further designing the sixth branched finger electrode line 224 between the third branched finger electrode line 222 and the fourth branched finger electrode line 223.

According to some embodiments of the present disclosure, lengths of the first branched finger electrode line 212, the second branched finger electrode line 213 and the fifth branched finger electrode line 214 are equal, which can ensure that the end of the first finger electrode sub-line 211 close to the first interval 2110 can collect currents in all directions, and current collection capabilities in all directions are kept the same. Lengths of the third branched finger electrode line 222, the fourth branched finger electrode line 223 and the sixth branched finger electrode line 224 are equal, which can ensure that the end of the second finger electrode sub-line 221 close to the second interval 2210 can collect currents in all directions, and current collection capabilities in all directions are kept the same.

According to some embodiments of the present disclosure, according to design requirements of photoelectric conversion efficiency of different IBC solar cells, one or more fifth branched finger electrode lines 214 may be provided, and one or more sixth branched finger electrode lines 224 may be provided.

The present disclosure further provides an IBC solar cell module. The IBC solar cell module includes the IBC solar cells described above, which can reduce manufacturing costs of the IBC solar cell module and a usage amount of metallized paste, and can also ensure photoelectric conversion efficiency of the solar cell. The IBC solar cells are electrically connected to form individual IBC solar cell string in an entirety or multi-slice (for example, ½-cut cells, ⅓-cut cells, ¼-cut cells) form. In some embodiments, the IBC solar cell module further includes a packaging material layer and a cover plate. The packaging material layer is configured to seal a plurality of IBC solar cell strings, and the cover plate covers the packaging material layer. For example, the packaging material layer may be made of an organic material, for example, ethylene vinyl acetate (EVA), polyolefin elastomer (POE) or polyethylene terephthalate (PET). The cover plate may be a cover plate with a light transmission function, for example, a glass cover plate or a plastic cover plate. As shown in FIG. 1, the IBC solar cell includes a semiconductor substrate 1, a plurality of finger electrode lines and a plurality of conductive lines 3. Each finger electrode line 2 include a first finger electrode line 21 and a second finger electrode line 22, and the first finger electrode line 21 and the second finger electrode line 22 are alternately arranged on the semiconductor substrate 1. The conductive line 3 includes a first conductive line 31 and a second conductive line 32, and the first conductive line 31 and the second conductive line 32 are alternately arranged. The first conductive line 31 is connected to the first finger electrode line 21, and the first conductive line 31 is spaced apart from the second finger electrode line 22. The second conductive line 32 is connected to the second finger electrode line 22, and the second conductive line 32 is spaced apart from the first finger electrode line 21.

The above are only preferred embodiments of the present disclosure and are not intended to limit the present disclosure. For those skilled in the art, the present disclosure may have various modifications and variations. Any modifications, equivalent substitutions, improvements and the like made within the principle of the present disclosure should fall within the protection scope of the present disclosure.

What is claimed is:

1. A busbar-free interdigitated back contact (IBC) solar cell, comprising:
   a semiconductor substrate;
   a plurality of finger electrode lines comprising a plurality of first finger electrode lines and a plurality of second finger electrode lines, wherein the plurality of first finger electrode lines and the plurality of second finger electrode lines are alternately arranged on the semiconductor substrate; and
- a plurality of conductive lines comprising a plurality of first conductive lines and a plurality of second conductive lines, wherein the plurality of first conductive lines and the plurality of second conductive lines are alternately arranged;
- wherein the plurality of first conductive lines is connected to the plurality of first finger electrode lines and spaced apart from the plurality of second finger electrode lines; the plurality of second conductive lines is connected to the plurality of second finger electrode lines and spaced apart from the plurality of first finger electrode lines,
- wherein each of the plurality of first finger electrode lines is formed by a plurality of first finger electrode sub-lines arranged at intervals, and a first interval is provided between two adjacent first finger electrode sub-lines of the plurality of first finger electrode sub-lines; each of the plurality of second finger electrode lines is formed by a plurality of second finger electrode sub-lines arranged at intervals, and a second interval is provided between two adjacent second finger electrode sub-lines of the plurality of second finger electrode sub-lines,
- wherein, for a first finger electrode line of the plurality of first finger electrode lines adjacent a second finger electrode line of the plurality of second finger electrode lines, the first interval of the first finger electrode line and the second interval of the second finger electrode line are mutually staggered,
- wherein a first conductive line of the plurality of first conductive lines passes through the second interval, and a second conductive line of the plurality of second conductive lines passes through the first interval,
- wherein a first branched finger electrode line and a second branched finger electrode line are connected to one end of a first finger electrode sub-line of the plurality of first finger electrode sub-lines close to the first interval; and a third branched finger electrode line and a fourth branched finger electrode line are connected to one end of a second finger electrode sub-line of the plurality of second finger electrode sub-lines close to the second interval, and
- wherein an angle α between the first branched finger electrode line and the second branched finger electrode line satisfies 0°<α<90°, and an angle β between the third branched finger electrode line and the fourth branched finger electrode line satisfies 0°<β<90°.

2. The IBC solar cell according to claim 1, wherein a width c1 of the first interval and a width c2 of the second interval both range from 100 μm to 1000 μm.

3. The IBC solar cell according to claim 2, wherein the width c1 of the first interval and the width c2 of the second interval both range from 200 μm to 900 μm.

4. The IBC solar cell according to claim 1, wherein the first conductive line passes through a middle position of the second interval, and the second conductive line passes through a middle position of the first interval.

5. The IBC solar cell according to claim 1, wherein the angle α between the first branched finger electrode line and the second branched finger electrode line satisfies 5°<α<85°, and the angle β between the third branched finger electrode line and the fourth branched finger electrode line satisfies 5°<β<85°.

6. The IBC solar cell according to claim 1, wherein a fifth branched finger electrode line is connected to the one end of the first finger electrode sub-line close to the first interval, and the fifth branched finger electrode line is located between the first branched finger electrode line and the second branched finger electrode line; a sixth branched finger electrode line is connected to the end of the second finger electrode sub-line close to the second interval, and the sixth branched finger electrode line is located between the third branched finger electrode line and the fourth branched finger electrode line.

7. The IBC solar cell according to claim 6, wherein lengths of the first branched finger electrode line, the second branched finger electrode line and the fifth branched finger electrode line are the same; and lengths of the third branched finger electrode line, the fourth branched finger electrode line and the sixth branched finger electrode line are the same.

8. The IBC solar cell according to claim 6, wherein one or more fifth branched finger electrode lines are provided, and one or more sixth branched finger electrode lines are provided.

9. An interdigitated back contact (IBC) solar cell module, comprising at least one IBC solar cell string formed by electrically connecting at least one IBC solar cell, wherein the at least one IBC solar cell comprises:
- a semiconductor substrate;
- a plurality of finger electrode lines comprising a plurality of first finger electrode lines and a plurality of second finger electrode lines, wherein the plurality of first finger electrode lines and the plurality of second finger electrode lines are alternately arranged on the semiconductor substrate; and
- a plurality of conductive lines comprising a plurality of first conductive lines and a plurality of second conductive lines, wherein the plurality of first conductive lines and the plurality of second conductive lines are alternately arranged,
- wherein the plurality of first conductive lines is connected to the plurality of first finger electrode lines and spaced apart from the plurality of second finger electrode lines; the plurality of second conductive lines is connected to the plurality of second finger electrode lines and spaced apart from the plurality of first finger electrode lines,
- wherein each of the plurality of first finger electrode lines is formed by a plurality of first finger electrode sub-lines arranged at intervals, a first interval is provided between two adjacent first finger electrode sub-lines of the plurality of first finger electrode sub-lines; each of the plurality of second finger electrode lines is formed by a plurality of second finger electrode sub-lines arranged at intervals, and a second interval is provided between two adjacent second finger electrode sub-lines of the plurality of second finger electrode sub-lines,
- wherein, for a first finger electrode line of the plurality of first finger electrode lines and adjacent a second finger electrode line of the plurality of second finger electrode lines, the first interval of the first finger electrode line and the second interval of the second finger electrode line are mutually staggered; and a first conductive line of the plurality of first conductive lines passes through the second interval, and a second conductive line of the plurality of second conductive lines passes through the first interval,
- wherein a first branched finger electrode line and a second branched finger electrode line are connected to one end of a first finger electrode sub-line of the plurality of first finger electrode sub-lines close to the first interval; and a third branched finger electrode line and a fourth branched finger electrode line are connected to one end of a second finger electrode sub-line of the plurality of second finger electrode sub-lines close to the second interval, and wherein an angle $\alpha$ between the first branched finger electrode line and the second branched finger electrode line satisfies $0°<\alpha<90°$, and an angle $\beta$ between the third branched finger electrode line and the fourth branched finger electrode line satisfies $0°<\beta<90°$.

10. The IBC solar cell module according to claim 9, wherein a width c1 of the first interval and a width c2 of the second interval both range from 100 µm to 1000 µm.

11. The IBC solar cell according to claim 10, wherein the width c1 of the first interval and the width c2 of the second interval both range from 200 µm to 900 µm.

12. The IBC solar cell module according to claim 9, wherein the first conductive line passes through a middle position of the second interval, and the second conductive line passes through a middle position of the first interval.

13. The IBC solar cell module according to claim 9, wherein a fifth branched finger electrode line is connected to the one end of the first finger electrode sub-line close to the first interval, and the fifth branched finger electrode line is located between the first branched finger electrode line and the second branched finger electrode line; a sixth branched finger electrode line is connected to the end of the second finger electrode sub-line close to the second interval, and the sixth branched finger electrode line is located between the third branched finger electrode line and the fourth branched finger electrode line.

14. The IBC solar cell module according to claim 13, wherein lengths of the first branched finger electrode line, the second branched finger electrode line and the fifth branched finger electrode line are the same; and lengths of the third branched finger electrode line, the fourth branched finger electrode line and the sixth branched finger electrode line are the same.

15. The IBC solar cell module according to claim 13, wherein one or more fifth branched finger electrode lines are provided, and one or more sixth branched finger electrode lines are provided.

* * * * *

UNITED STATES PATENT AND TRADEMARK OFFICE
CERTIFICATE OF CORRECTION

PATENT NO. : 12,199,203 B2
APPLICATION NO. : 18/234845
DATED : January 14, 2025
INVENTOR(S) : Xiu Feng et al.

Page 1 of 1

It is certified that error appears in the above-identified patent and that said Letters Patent is hereby corrected as shown below:

In the Specification

In Column 7, Line 35, delete "30°, 40°, 60°," and insert --30°, 40°, 50°, 60°,--.

Signed and Sealed this
Thirteenth Day of May, 2025

Coke Morgan Stewart
*Acting Director of the United States Patent and Trademark Office*